Nov. 15, 1966 W. SHOCKLEY 3,286,138

THERMALLY STABILIZED SEMICONDUCTOR DEVICE

Filed Nov. 27, 1962 5 Sheets-Sheet 1

INVENTOR.
WILLIAM SHOCKLEY

BY

Flehr and Swain
ATTORNEYS

THERMALLY STABILIZED SEMICONDUCTOR DEVICE

Filed Nov. 27, 1962 5 Sheets-Sheet 2

INVENTOR.
WILLIAM SHOCKLEY

BY

Flehr and Swain

ATTORNEYS

Nov. 15, 1966 W. SHOCKLEY 3,286,138

THERMALLY STABILIZED SEMICONDUCTOR DEVICE

Filed Nov. 27, 1962 5 Sheets-Sheet 3

INVENTOR.
WILLIAM SHOCKLEY
BY
Flehr and Swain
ATTORNEYS

INVENTOR.
WILLIAM SHOCKLEY
BY
Flehr and Swain
ATTORNEYS

Nov. 15, 1966 W. SHOCKLEY 3,286,138

THERMALLY STABILIZED SEMICONDUCTOR DEVICE

Filed Nov. 27, 1962 5 Sheets-Sheet 5

INVENTOR.
WILLIAM SHOCKLEY

BY

Flehr and Swain
ATTORNEYS

United States Patent Office 3,286,138

Patented Nov. 15, 1966

3,286,138
THERMALLY STABILIZED SEMICONDUCTOR DEVICE

William Shockley, Los Altos, Calif., assignor to Clevite Corporation, a corporation of Ohio Filed Nov. 27, 1962, Ser. No. 240,366
13 Claims. (Cl. 317—235)

This invention relates generally to semiconductor devices and more particularly to thermally stable semiconductor devices.

A serious limitation exists in the power handling capacity of many semiconductor devices, for example, power transistors, due to a form of thermal instability which causes current concentrations to develop. The thermal instability referred to is not the usual thermal run-away in which a temperature increase causes an increased current of thermally generated carriers into the base layer, resulting in more emission and more power dissipation, which, in turn, produces a further temperature increase. The unstable mode referred to is one in which the current density and temperature tend to build up in one region of the device at the expense of the remaining active device area while the total external current remains substantially constant. So-called "hot spots" develop which may damage or destroy the device.

The instability arises mostly from large positive temperature coefficient of current flow in the device. As a result of this large coefficient, any random fluctuation or imperfection in the semiconductor device may produce an increase in current in one part of the structure with respect to another part. This increase in current, in turn, produces additional heating and further increase in current. In essence, positive feedback occurs with consequent build-up of current at this part of the structure. As the current builds up, non-linear effects set in.

It is a general object of the present invention to provide a semiconductor device in which local "hot spots" are minimized.

It is still another object of the present invention to provide a semiconductor device which includes a distributed resistance for reducing thermal instability.

It is another object of the present invention to provide a semiconductor device in which the current is substantially uniformly distributed over the area of the device for predetermined operating conditions.

It is a further object of the present invention to provide a semiconductor device in which the temperature is substantially uniform over the power dissipating area of the device for predetermined operating conditions.

It is a further object of the present invention to provide a semiconductor device in which the thermal instability at defects is substantially minimized.

It is a further object of the present invention to provide a semiconductor device in which thermal instability initiated by random fluctuations is minimized.

It is a further object of the present invention to provide a semiconductor device which incorporates a distributed electrical resistance in association with the emitter region to stabilize the device against thermal instability.

It is a further object of the present invention to provide a semiconductor device in which the current flow through the device is spread over a wide region of the base layer and penetrates further from the base contact under the emitter body for steady state and alternating current conditions.

It is a further object of the present invention to provide a semiconductor device in which the current density for a given level of total current is reduced to reduce non-linear effects associated with high current density and loss of emitter efficiency.

It is a further object of the present invention to provide a semiconductor structure having a negative feedback resistor in thermal contact with the emitter region to provide good linearity.

It is still a further object of the present invention to provide a semiconductor device having a resistance, with a relatively high positive temperature coefficient of resistance, between the emitter contact and the emitter region so as to reduce the voltage drop across this resistance required to prevent negative resistance and lateral instability within the device.

It is still a further object of the present invention to provide a power transistor which includes a distributed resistance in series between the emitter contact and the emitter region to increase distribution of the current.

It is a further object of the present invention to provide a semiconductor device having a resistance with a positive temperature coefficient of resistance in series with the emitter current path and in heat exchange relationship with respect to the emitter region of the device.

These and other objects of the invention will become more clearly apparent from the following description when taken in conjunction with the accompanying drawing.

Referring to the drawing.

As described above, a serious limitation with the power handling capacity of power transistors and other large area devices is due to a form of thermal instability which causes current concentrations to build up. To better understand the problem of temperature instability and the effects of the same, reference is made to the schematic circuits of FIGURES 1 and 2 and the theoretical curves of FIGURE 6.

Figure 6:
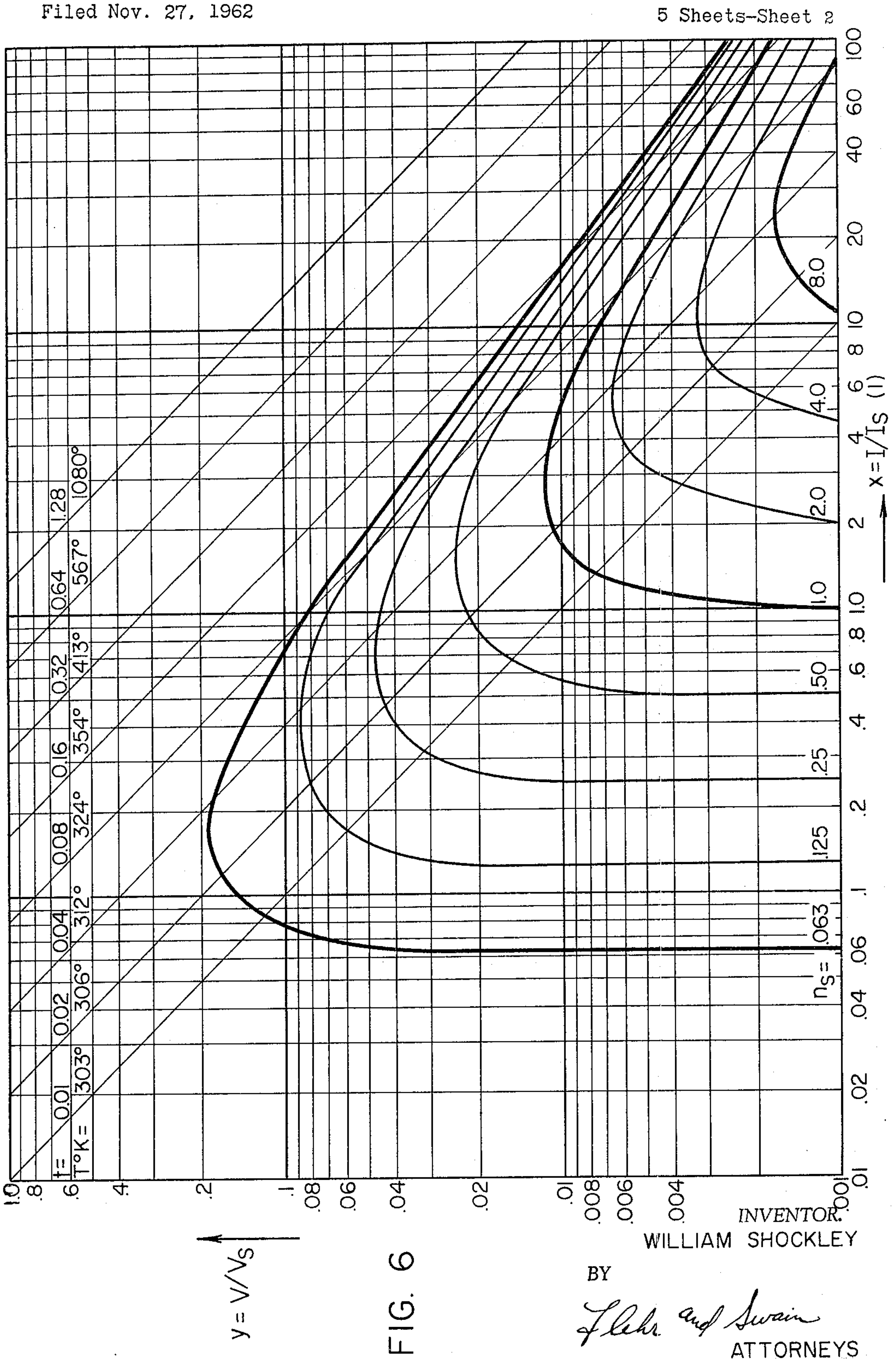
FIGURE 6 is a curve of the collector current-voltage characteristics for a silicon transistor at various constant base voltages.

Referring to FIGURE 6, there is shown the theoretical curves for the current-voltage characteristics of a transistor for a set of constant base voltages. It is seen from this curve that if the current is increased, the voltage first rises towards a maximum value and then, with further increase in current, it drops, producing a negative resistance.

Figure 1:
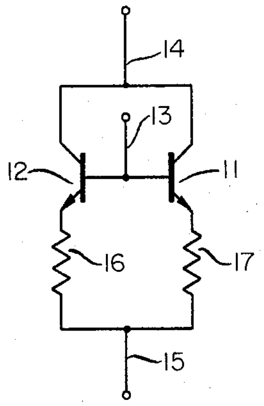
FIGURE 1 is a schematic circuit diagram illustrating two transistors connected in parallel with each including a series emitter resistance.

Referring now to FIGURE 1, there is shown two transistors 11, 12 connected in parallel. The base and collector terminals of each transistor are connected to voltage sources by the common terminals 13 and 14, respectively. The emitters are connected to a common voltage terminal 15 through emitter resistors 16 and 17. Considering first the limiting case in which the resistors have negligible resistance, operation is substantially as described with reference to FIGURE 6. If constant current is passed through the common collector terminal 14 of FIGURE 1 and constant emitter and base voltage is applied to the other two terminals 15 and 13, then an instability can occur if one of the transistors is in a negative resistance condition. The instability will cause any disturbance of current between the two to build up rapidly so that one transistor carries predominantly all the current while the other carries practically no current. This phenomenon is closely similar to the so-called "current hogging" by one of a pair of parallel thermistors.

It is known in the transistor circuit art that two transistors connected in parallel can be caused to carry substantially the same current by introducing sufficiently large lumped emitter resistances 16 and 17. These resistors then largely determine the current, with the characteristics of the transistor itself becoming relatively unimportant. This, of course, will eliminate the instability which is due to thermal effects even though it reduces the gain characteristics of the transistor circuit.

Figure 2:
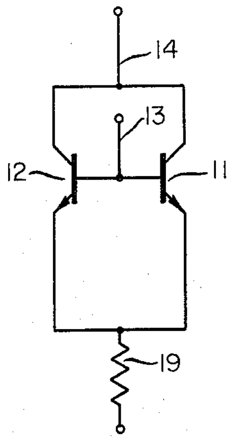
FIGURE 2 shows two transistors connected in parallel with a common emitter resistance.

However, when one considers FIGURE 2 in which like reference numerals refer to the parts, the series resistance 19 is a common resistor. In this case, a transfer current from one transistor to the other has no effect upon the flow through the resistor 19 and the latter, in turn, has no influence upon stabilizing the two transistors against internal instability even though it may have a large value of resistance.

The later is similar to that which takes place in an extended or large area semiconductor device, such as a power transistor, having a series emitter resistance. Various parts of the structure can each act like the individual transistors illustrated and one area may then hog all of the current causing a local hot spot.

In accordance with the present invention, there is provided in a large or extended area semiconductor device structure means for stablizing the current flow through the device. The stabilizing influence in an extended large area semiconductor device is achieved by interposing a distributed resistor in series with the emitter current path.

Figures 3, 4:
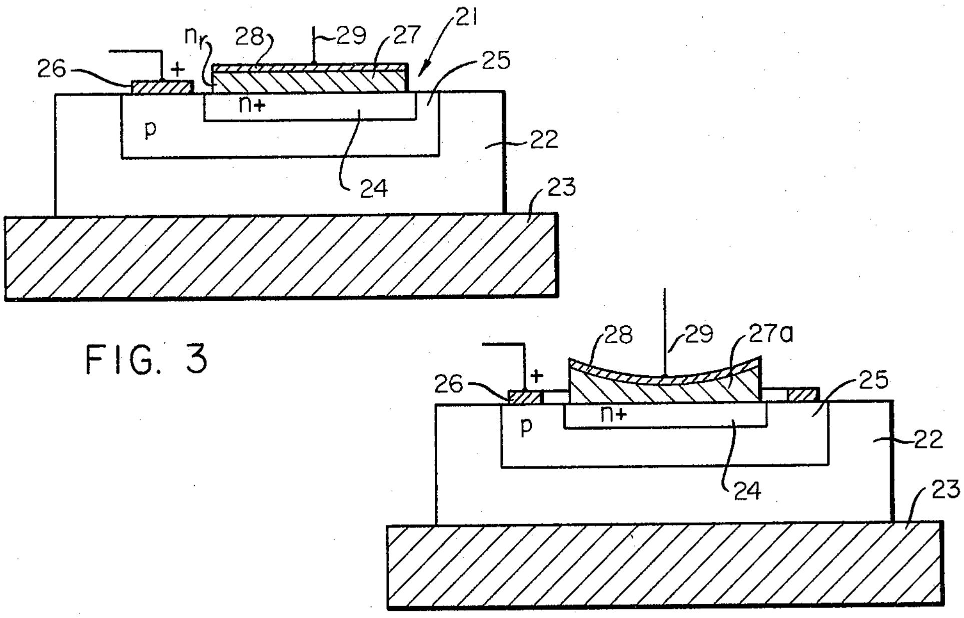
FIGURE 3 is an elevational view, partly in section, showing a semiconductor device incorporating the invention.
FIGURE 4 is an elevational view, partly in section, showing another device incorporating the invention.

One form of stabilizing emitter resistance in series with the operating portions of an emitter junction is shown in FIGURE 3. In FIGURE 3, there is shown a transistor 21 which has its collector region 22 in conductive and thermal contact with a heat sink 23 which is regarded as being maintained at constant temperature. Inset into the collector region 22 and formed by a well-known manner is a p-type base region 25. Inset into the base region 25 is an n-type emitter region 24 of high impurity concentration represented as $n+$. Electrical connection is made to the base region through the ohmic contact 26. A layer of resistive material 27 is disposed over substantially the entire surface of the $n+$ emitter region and is contacted uniformly over its upper area by a contact 28 which is suitably connected to the lead 29. The contact 28 is substantially coextensive with the resistive layer 27 and is selected to have a very low resistance so that the entire upper surface is at substantially equal potential. It is evident that any tendency of current to localize in a given region of the emitter would cause an additional voltage drop across this portion of the resistive layer which will serve to reduce the emitter-base voltage in the underlying portion of the emitter-base junction and minimize the current build-up in this portion of the device.

Although a particular geometry is shown in FIGURE 3, it is evident that the invention can be applied to any geometry of the emitter region structure such as interdigitated structures, comb structures, star structures and any other type of well-known structures used in semiconductor devices.

There are also other advantages associated with the resistive emitter layer 27. If the emitter current produces a voltage drop across this layer which is given by $n_r$ times the thermal voltage $kT/q$ at the operating temperature (where $k$ is the Boltzmann's constant; T is the temperature in degrees Kelvin; and $q$ the charge on the electron), then it can be shown that if $n_r$ is substantially greater than unity, the current crowding effect due to voltage drops in the base layer as it proceeds under the emitter will be reduced by a factor approximately equal to $n_r/2$. A similar greater penetration of the current density under the emitter also occurs for alternating current signals. A further advantage in spreading the current more uniformly over the emitter-base junction is that the current density is reduced for a given total current. Thus, non-linear effects associated with the higher current densities are significantly reduced in a device constructed in accordance with the invention.

Since for a given power level, the temperature rise is increased by concentration of power due to the current crowding, it is evident that the additional spreading out of current due to the resistive emitter layer is advantageous.

If the resistive emitter layer 27 has a positive temperature coefficient of resistance, then further advantage can be achieved. As will be shown below analytically, the benefit arises from the fact that as the current tends to concentrate in a given region, it will produce a high temperature rise at this point and this, in turn, will increase the value of the stabilizing resistor in series with this portion of the emitter layer. Because of this feature, it is possible to produce stabilization with smaller voltage drops across the resistive emitter layer in a configuration like FIGURE 3.

Referring to FIGURE 4, there is shown another embodiment of the invention which carries reference numerals like those of FIGURE 3 when referring to like parts. However, the layer 27 is labelled 27*a* since the layer is of non-uniform thickness. This varying thickness produces a smaller conductance per unit area at the edges than in the middle. Similar results can be produced by varying the resistivity as well as thickness, or both. By properly choosing the variation in resistance, the effect of voltage drops due to base current in the base layer can be compensated so that the voltage across the emitter base junction is constant over the entire area of the emitter. It is evident that in this case for a given current level, the power will be most uniformly spread and temperature rise will be reduced. By allowing for variation of thermal resistance to the heat sink over the area of the emitter junction and adjusting the local power density, a uniform temperature rise can be produced. It will be particularly important to reduce the maximum temperature rise under a condition in which the transistor is operating at maximum power dissipation and has the smallest emitter currents for this maximum power dissipation. For larger currents and smaller voltages at the same power, the stabilizing action of the resistive layer will be greater due to the greater voltage drop across it and thus somewhat lower temperature rise will be possible at higher currents for a given power level than at lower currents for the same power level.

Figure 5:
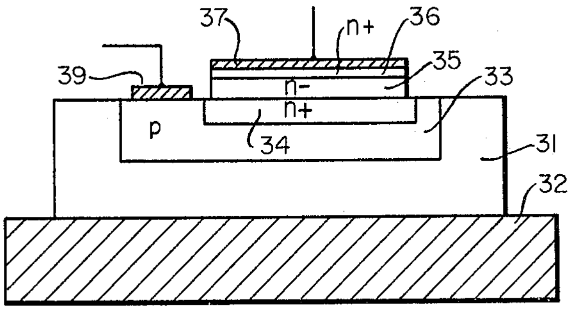
FIGURE 5 illustrates a semiconductor device in which the resistive layer in thermal contact with the emitter comprises a layer of semiconductor material.

An advantageous type of resistive emitter layer is a layer of lightly doped ($n-$) silicon formed on a silicon transistor. This layer can be applied in various known ways as, for example, by epitaxial growth. In particular, an $n-$ layer can be grown on a diffused $n+$ layer to produce a structure such as that shown in FIGURE 5 which includes an n-type collector region 31 mounted on a heat sink 32 with an inset p-type base region 33 which, in turn, has inset therein an $n+$ type emitter region 34. The $n-$ resistive layer 35 is then applied over the $n+$ emitter layer and forms a relatively good ohmic connection therewith. An additional $n+$ layer 36 may be formed at the upper surface of the $n-$ layer to which a metallic contact 37 may be applied. Suitable electrical connection is made to the base layer as indicated at 39.

The electric fields present in the $n-$ layer under operating conditions should, as will be discussed below, be sufficient to produce voltage drops across this layer in the order of four or more times the thermal voltage at operating temperature. Such drops are, however, sufficient to sweep minority carriers through the layer. It is important that the minority carriers do not accumulate in this $n-$ resistive layer for if they did so, its resistance would be significantly lowered. Since at high current levels, injection through the emitter layer may occur, it may be desirable to provide a layer of high recombination constants at the interface between the resistive $n-$ layer and the $n+$ emitter layer. This will tend to eliminate the minority carrier injection into the $n-$ layer. Alternatively, high recombination rates are beneficial at the edge of the resistive layer towards which the minority carriers move in order to reduce effects of their accumulation.

A way of accomplishing this is to use a very thin layer of high resistance metal, making ohmic contacts with both the $n-$ and $n+$ layers. The lateral conductance of a very thin layer would not be so large, however, as to effectively short out local regions of the $n-$ layer. Alternatively, another way of accomplishing the same result is to make the $n-$ layer of a semiconductor material of significantly wider energy gap so that the injection of minority carriers into it is prevented or substantially reduced.

For an $n-$ layer of silicon operating at temperatures substantially above room temperature, the ionization of the centers is substantially complete, and further increases in temperature will produce decreases in mobility of the electrons in the layer and consequently will give it a positive temperature coefficient of resistance. The high electric fields in the layer will sweep out minority carriers and suppress a negative coefficient of resistance due to intrinsic conductivity developing.

Even if such a layer does not have a positive temperature coefficient of resistance at room temperature, it will still have very beneficial effects if this occurs at higher temperatures; since any tendency for the current to become unstable and concentrate in a local region, producing a high temperature rise, will lead to marked increases in the resistance of this layer with consequent stabilization and prevention of undesirable high current buildups.

If the resistance of the emitter layer is high enough to produce voltage drops which are several times larger than the thermal voltage $kT/q$ at the operating temperature, then the negative resistance of any region of the extended structure, as represented in FIGURE 6, will be largely eliminated. Straightforward calculations along the lines discussed below lead to the following conditions to eliminate negative resistance with the use of a silicon layer.

TABLE I

| | | | | | |
|---|---|---|---|---|---|
| $(T-T_s)$ °K | 10 | 50 | 100 | 200 | 300 |
| T°K | 310 | 350 | 400 | 500 | 600 |
| T°C | 37 | 77 | 127 | 227 | 327 |
| $V_{er}=n_rU$ | 0 | 0.076 | 0.148 | 0.261 | 0.362 |
| $V_{er}$ (modified) | 0 | 0.052 | 0.072 | 0.073 | 0.064 |
| $V_{er}$ $(n_{\mu n}=0)$ | 0 | 0.10 | 0.25 | 0.60 | 0.99 |

In Table I, the operating temperature of the device is represented by T and the ambient temperature of the transistor is represented by the temperature $T_s$ which is the temperature of the heat sink. Thus, the first row of the table is the temperature rise; the second row is the operating temperature of the emitter region in degrees Kelvin; the third row is the corresponding temperature in degrees centigrade. The temperature of the heat sink is assumed to be 300° K. The voltage drop across the resistive emitter layer $V_{er}$ for that uniform current distribution corresponding to an emitter junction voltage of 0.5 volt at 300° C. is represented in the fourth row, expressed in volts. This voltage drop is the value sufficient to so reduce the positive temperature coefficient of current increase for constant applied voltage to the base terminal so that negative resistance does not arise. In calculating this voltage drop, allowance for the increase in the value of the resistor is included, due to the temperature rise from the ambient temperature to the operating temperature. For lower voltage on the collector and hence lower power dissipation so as to reduce the temperature rise, the voltage drops for the same current as in the fourth row are given in the fifth row as $V_{er}$ (modified). In the table, a comparison is also made for the voltage drops required across a resistor which had a resistance independent of temperature, $V_{er}(n_{\mu n}=0)$. It is seen that substantially larger voltage drops would be required for such a resistor at the higher operating temperatures.

Figure 7:
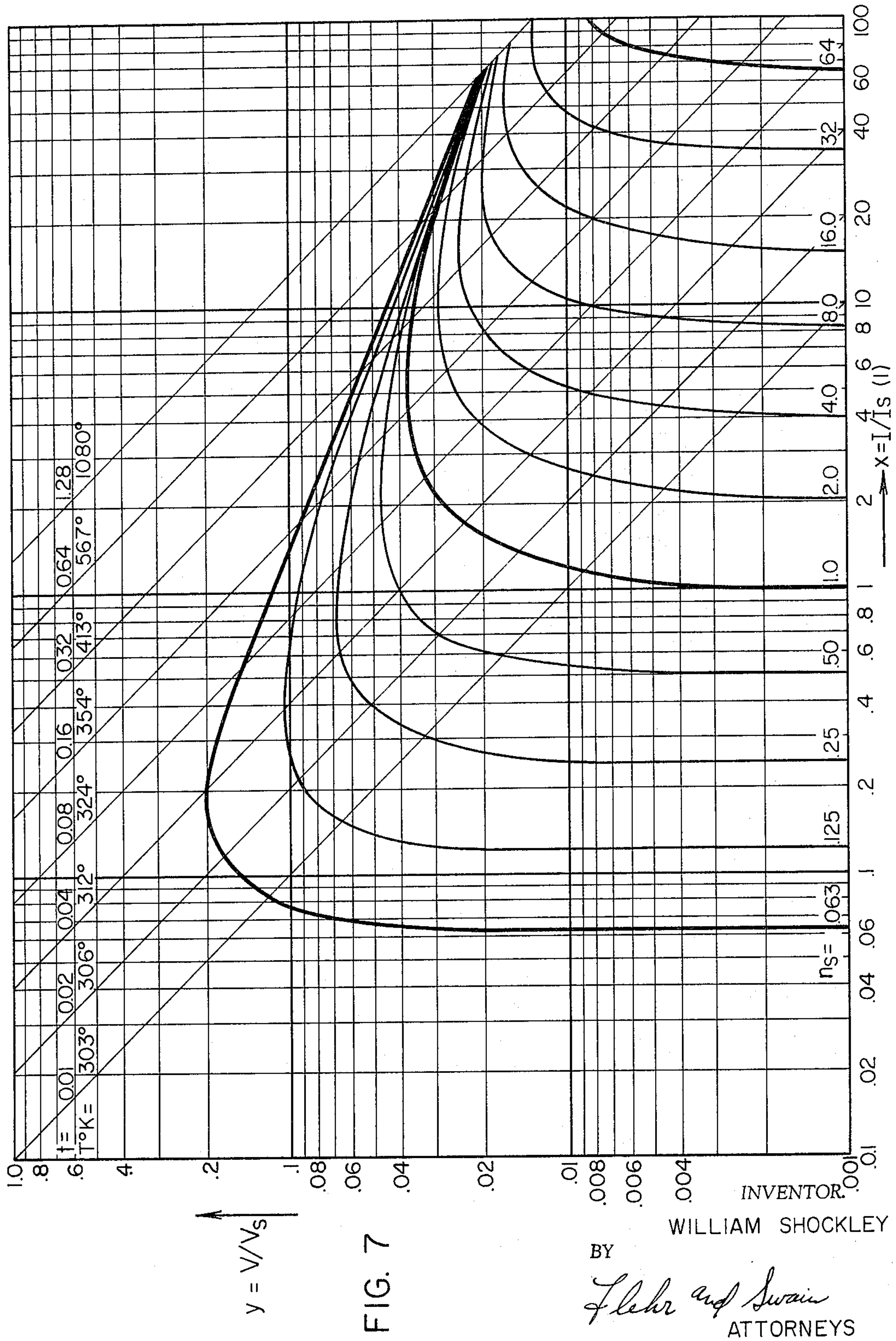
FIGURE 7 is a curve of the collector current-voltage characteristics for a silicon transistor at various constant base voltages with a temperature independent distributed emitter resistor.
Figure 8:
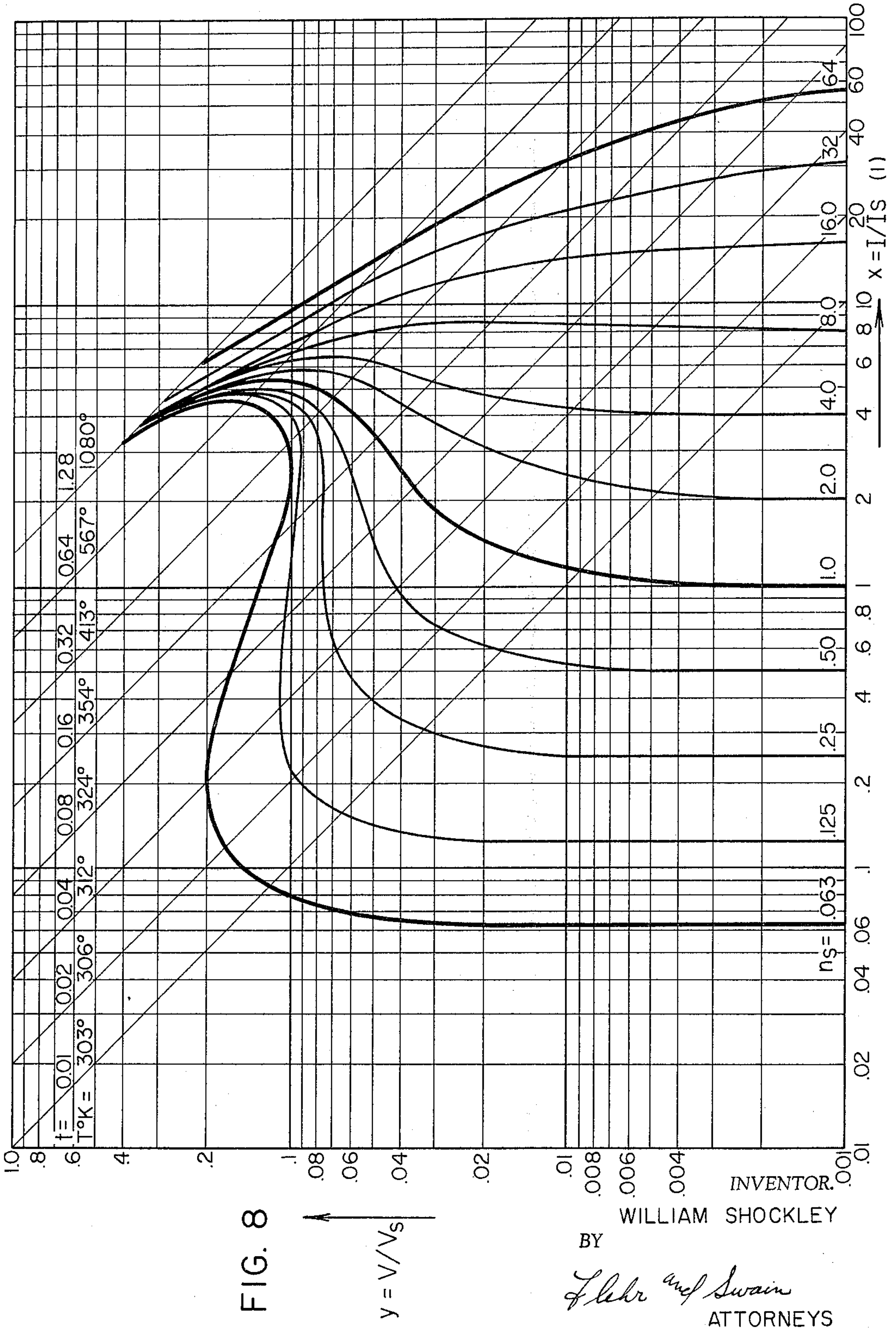
FIGURE 8 is a curve showing the collector current-voltage characteristic for a silicon transistor at various constant base voltages with a resistor having a positive temperature coefficient in heat exchange relationship with the emitter layer.

The required voltage drops across the resistive layer set forth in the above table for the case of a resistive layer of n-type silicon are related to conditions in which the collector voltage versus collector current at constant voltage on the base terminal curves have zero slope. Three such sets of curves are shown in FIGURES 6, 7 and 8. FIGURE 6, as discussed previously, shows the curves for a silicon transistor mounted on a heat sink at a temperature of 300° with no series resistance present. In constructing the curves, it has been assumed that the temperature drop takes place through silicon and the dependence of thermal conductivity upon temperature for silicon has been included in computing the curves. The curve represented by the $n_s$ index 1.0 corresponds to an emitter base voltage of 0.50 volt, a typical value for a silicon transistor. The other base voltages are those which produce currents differing from the reference value by factors of 2. The current and voltage scales are expressed in certain arbitrary reference units, which are discussed further in the analytical section. FIGURE 7 represents a similar diagram for the case in which a distributed resistive layer is present having a zero temperature coefficient of resistance. The particular resistive layer chosen is one which has a voltage drop of 0.025 volt across it for the current corresponding to the reference value $I_s(1)$ so that unit value V is obtained for $n_s$. In this case, then, the voltage applied to the base terminal is 0.525 volt, assuming that the metal contact to the resistive layer is grounded. The transistor assumed for the derivation of FIGURE 7 is otherwise identical with the transistor of FIGURE 6. It is seen that very much higher temperature rises are possible for the transistor containing the resistive emitter layer without negative resistance arising. For no resistive layer present, it is seen that negative resistance, in general, arises from a temperature rise higher than about 10° C. With a resistive layer present, however, it is possible to have temperature rises of as high as 300° C. without negative resistance occurring. For these temperature rises, however, the voltage drop across the resistive layer can be quite large, since this drop is larger than the reference value of 0.025 volt by the ratio of the current to the reference current unity on FIGURE 7.

FIGURE 8 represents the corresponding situation in which the resistive emitter layer has a positive temperature coefficient corresponding to the decrease in electron mobility for electrons in n-type silicon. It is seen that in this case, for base voltages larger than the value corresponding to $n_s=0.25$, no maximum occurs in the voltage versus current curve and thus no thermal instability can arise.

It should be noted that for the temperature independent resistance case of FIGURE 7, if a large area transistor or two similar transistors in parallel were maintained at a constant voltage, it would, in general, be possible for some values of base voltage for one of them to carry current on a region of negative slope and the other one on a region of positive slope. A similar situation will not be true with the resistor having a positive temperature coefficient, at least for voltages below the value represented by $V$=applied voltage; $V_s$=reference value; and $V/V_s$=.077 on the diagram. As an example of the advantage of operating with the positive temperature coefficient resistive layer, we consider the situation corresponding to a temperature rise of approximately 100° C. For this case, the minimum current at which it would be safe to operate corresponds to $x=17$ on FIGURE 7. For this case, with two transistors operating in parallel, neither can get to a negative resistance condition unless the current is increased by approximately 50%, and this is regarded as a safe operating margin. For 17 units of current in this case, the voltage drop will be 0.425 volt, since it will be 17 times larger than the voltage at the reference current $x=1.0$ which produces 25 millivolts. For the case of the resistor with positive temperature coefficient, a corresponding safe current for operation would be at $x=3.8$, this corresponding to the curve with base voltage corresponding to $n_s=0.25$, for which no negative resistance arises. For this current of $x=3.8$, the voltage drop will be $0.025\times3.8\times2.24$. The last factor 2.24 represents the increase in resistance of a silicon resistor in increasing its temperature from 300° K. to approximately 413° K. This voltage drop is 0.286 volt, which is seen to be substantially smaller than the voltage drop for the case of a temperature independent resistor. From this, it follows that increases in current for the case of the temperature dependent resistor can be accomplished with smaller changes in base voltage than for the case in which the resistance is temperature independent. In fact, to double the current from the safe values discussed above corresponding to $x=17$ and $x=3.8$ (with voltage drops across the resistive layer of 0.425 and 0.286, respectively) will require additional contribution to the base voltage to overcome the additional voltage drop across the resistive layer of 0.425 and 0.286 volt if the transistor is maintained at constant power level by halving the voltage so as to maintain it at constant temperature. This shows that the greater power gain will be obtained from the transistor with the resistive layer with positive temperature coefficient of resistance than from the transistor having a temperature independent resistive layer.

The foregoing and other features of the invention will be more clearly understood from the brief analytical discussion which is set forth in the following. A very important quantity in determining the stability condition and the occurrence of negative resistance in large area transistors is the partial derivative of the logarithm of current with respect to the logarithm of temperature for a constant base voltage, it being assumed that the collector voltage is high enough to draw substantial current and that the emitter is grounded. This derivative is represented by the symbol $a_0$ where $a_0$ equals $$\gamma lnI/\gamma lnT \qquad (1)$$

If the transistor is connected to a heat sink and is dissipating power under a steady state condition, then the power input, the voltage V times the current I, must be equal to the heat flow to the heat sink. Representing the heat flow to the heat sink as H(T), the steady state condition required is $$IV=H(T) \qquad (2)$$

Straightforward manipulation leads to $$\gamma lnV/\gamma lnI=-1+(dlnH/dlnT)/a_0 \qquad (3a)$$

from which it is seen that a negative differential resistance will arise unless the second term on the right-hand side of the equation is greater than unity so that $$A_0(dlnT/dlnH)<1 \qquad (3b)$$

The marginal condition for a negative resistance depends upon the law of heat flow. If it is assumed that the heat conduction is independent of temperature, then we may write $$H(T)=h(T_s)(T-T_s) \qquad (4)$$

where $T_s$ is the temperature of the heat sink and $h(T_s)$ is the thermal conductance from the operating part of the transistor to the heat sink (measured in watts per °K.). This assumption for heat flow leads to $$dlnH/dlnT=T/(T-T_s) \qquad (5)$$

and in equation (3$b$) to a stability condition $$a_0(T-T_s)/T<1 \qquad (6)$$

If the thermal resistance through which the temperature drop to the heat sink occurs largely from silicon, then it should be noted that the thermal conductivity of the silicon varies inversely as the absolute temperature to a satisfactory degree of approximation over the range of interest of most effects for silicon transistors. See, for example, the article by R. G. Morris and Jerome G. Hust, Phys. Rev. 124, 1426 (1961). From 300° K. to 700° K., the thermal conductance can be approximated by $330/T$ (watts/cm. °K.). For this law of thermal conductance, it can be shown that $$H(T)=h(T_s)T_s ln(T/T_s) \qquad (7)$$

so that the stability condition becomes $$a_0 ln(T/T_s)<1 \qquad (8)$$

In order to apply these formulas to an actual transistor, values must be obtained for the quantity $a_0$. This can readily be done in terms of good approximations for the law of current flow through the base layer. For most practical purposes, at high power levels the emitter current and the collector current can be taken as being substantially equal, and the current density can be written in the form $$I/A=(q^2n_i^2D_n/Q)\ \exp\ q(V_b-V_e)/kT \qquad (9)$$

This equation may readily be derived from Transistor Technology, vol. 2, D. Van Nostrand, 1958, page 395, Equations 9 and 13, where Q is the total charge per unit area of majority carriers in the base layer; I is the total current; A is the area; $q$ is the charge of an electron; $n_i$ is the intrinsic concentration; $D_n$ is the diffusion constant for electrons in the base layer; $V_b$ is the base voltage; and $V_e$ is the emitter voltage. The example here corresponds to an npn transistor which results in obvious changes from the pnp transistor of the reference. A typical operating emitter bias for a silicon junction transistor is 0.50 volt, corresponding to a value of 20 for the argument of the exponential term in Equation 9. For constant emitter base voltage, the derivative of logarithm of current in respect to logarithm of temperature is readily found to be $$a_0=q(V_g-V_b+V_e)/kT+n_T\cong30 \qquad (10)$$

where $V_g$ is the effective value for the energy gap as it enters into the intrinsic concentration term $n_i$ and $n_T$ is the power to which the absolute temperature should be raised in order to give the correct temperature dependence for the $n_i^2D_n$ term in Equation 9 when $V_g$ is used for the energy gap. For silicon, as discussed, for example, in E. M. Conwell, Proc. IRE 46, 1281 (1958), it is found that $n_T$ is 1.5 and $V_g$ is 1.21 volts. These values for an emitter junction voltage of 0.5 volt lead to the approximate value of 30 for $a_0$ represented in Equation 10. The preceding analysis leads readily to the conclusion that $a_0$ is a function both of the current density (through the dependence of $V_b - V_e$ upon current density) and the temperature in the form $$a_0(I',T') = a_0(I,T) + ln(I/I') + n_T ln(T'/T) \qquad (11)$$

where I and T correspond to $a_0=30$ and I' and T' are different values of current and temperature. From this, it is seen that changes in absolute temperature of a factor of 2 produce changes in $a_0$ of less than 10%, and changes by a factor of 10 in current produce a change of about 8% in $a_0$. For most practical purposes, $a_0$ for silicon may be taken to be a constant with a value of 30. For other semiconductor materials at approximately the same current density conditions, the value $a_0$ will not be very different.

Combining the results of Equation 10 with Equation 6 or 8, it is readily seen that the maximum temperature rise above the ambient before the onset of negative resistance is the order of 10° C.

The current voltage curves of FIGURES 6, 7 and 8, previously described, are based upon a reference value of emitter base voltage of 0.50 volt at an ambient temperature $T_s=300°$ K. or 27° C. They are also based on the law of heat flow of equation 7.

In order to calculate how these curves arise, it is necessary to introduce the emitter voltage in Equation 9 through the relationship $$V_e = R(T)I = n_r kT/q \qquad (12)$$

where R(T) is the effective resistance of the resistive emitter layer under the operating current conditions. For design purposes, the R(T) value of interest can be taken by finding the current distribution and computing $V_e$ at the location where the emitter base voltage is largest in the forward direction, and dividing this voltage by the total current I, in this way allowing for current crowding effects. Introducing this Equation 12 into the current expression of Equation 9 and allowing for the dependence of the resistance R upon temperature, it is found that the derivative of logarithm of current in respect to logarithm of temperature for constant voltage applied between the base terminal and the metal contact to the resistive layer is reduced from the value $a_0$ to a new value $a_{0r}$ given by $$a_{0r} = a_0[1-(n_r/a_0) dlnR/dlnT]/(1+n_r) \qquad (13)$$

in which $n_r$ is the number of units of thermal voltage drop across the resistive layer under the conditions of operation. It is seen that this $a_{0r}$ may be substantially smaller than $a_0$, with the consequence that the permitted temperature rises in accordance with Equation 6 or 7 may be correspondingly larger. For a resistive layer composed of n-type silicon, operating in the range in which the resistance is controlled by the mobility of electrons, it is readily found from the literature (see, for example, the work cited for Conwell) that $$dlnR/dlnT = -dln\mu_n/dlnT = n_{\mu n} = 2.5 \qquad (14)$$

where $\mu_n$ is the mobility and the symbol $n_{\mu n}$ is the exponent of temperature in the expression for mobility.

Combining Equation 13 with Equation 8 and using the values of 30 and 2.5 for the terms of Equations 10 and 14, it is readily possible to determine the values of $n_r$ and $V_e$ corresponding to the limiting stable condition. These are the values given in Table I.

The current voltage curves of FIGURES 7 and 8 correspond to a resistor which at the ambient temperature $T_s=300°$ K. produces a drop of $kT_s/q=U_s=0.025$ volt, when the voltage across the emitter base junction is 0.50 volt. The other curves of FIGURES 7 and 8 correspond to base voltages given by $$V_b(n_s) = 0.50 + 0.025(n_s + ln\ n_s) \qquad (15)$$

where the second term produces a thermal voltage drop for the unit reference current plus an additional thermal voltage drop across the emitter-base junction itself, each time that the current density is raised by a factor of $e$ in accordance with Equation 9. For FIGURE 6, the term in $n_s$ is, of course, missing in Equation 15.

Inserting the base voltage of Equation 15 into Equation 9 leads to a dependence of current upon temperature for each base voltage value specified by $n_s$. The relationship of collector voltage to collector current and base voltage is obtained by introducing the power dissipation relationship given by Equation 2. In connection with these calculations, it is convenient to introduce three reference values for current, power and voltage:

$$I_s(1) = kT_s/qR(T_s) = kT_s/qR_s = U_s/R_s \qquad (16)$$

$$P_s = h(T_s)T_s \qquad (17)$$

$$V_s = P_s/I_s(1) \qquad (18)$$

where $I_s(1)$ is the current corresponding to an emitter base junction voltage of 0.50 volt at the temperature $T_s$, and in accordance with the convention used in the figures $R(T_s)=R_s$ is the resistor which gives the thermal voltage drop for this current. When $I_s(1)$ flows at temperature $T_s$, the emitter base voltage is such that $a_0$ has the value 30 of Equation 10. This applies to all three of FIGURES 6, 7 and 8.

The current, voltage and temperature variables, respectively $s$, $y$ and $t$ of the figures, are given in terms of the units of current voltage and ambient temperature as follows:

$$I = xI_s(1) \qquad (19)$$

$$V = yV_s \qquad (20)$$

$$T = T_s \exp t \qquad (21)$$

From these, it is readily found that the power relationship of Equation 2 becomes $$xy = t \qquad (22)$$

Using Equation 9 to determine current ratios and referring to Equations 14 and 15, it is found that $$ln\ x = n_T t + (a_0 - n_T)e^{-t} + e^{-t}(n_s + ln\ n_s) - x \exp(n_{\mu n} - 1)t \qquad (23)$$

for FIGURES 7 and 8, while for the case of no resistive layer, the relationship is $$ln\ x = n_T t + (a_0 - n_T)e^{-t} + e^{-t} ln\ n_s \qquad (24)$$

The families of curves of FIGURES 6, 7 and 8 are obtained by straightforward numerical calculations from Equations 22, 23 and 24.

In general, temperature rises of the order of 25% to 30% or more of the absolute ambient temperature $T_s$ will be permitted by the materials of which the transistor is constructed. However, at the present time, no transistors can operate in parallel in such ranges without relatively large series resistors involved as discussed in connection with Table I presented above.

In order to operate stably with a temperature rise of 18% corresponding to $t=0.16$ in FIGURES 7 and 8, it is seen that for $n_{\mu n}=0$ the maximum permitted value $y_M$ for $y$ must be less than 0.04 for safe parallel operation, whereas for $n_{\mu n}=2.5$, $y_M=0.076$. Hence, the $n_{\mu n}=2.5$ emitter resistor in intimate thermal contact with the emitter junction will permit operation to a maximum voltage $$V_M = 0.076\ V_s = 0.076\ P_s R_s/U_s \text{ for } n_{\mu n}=2.5 \qquad (25)$$

versus $$V_M = 0.04\ V_s = 0.04\ P_s R_s/U_s \text{ for } n_{\mu n}=0 \qquad (26)$$

Thus, an improvement of $V_M$ from values below 0.05 $P_s R_s/U_s$ to values substantially higher is accomplished by incorporating into the transistor a resistor with positive temperature coefficient of resistance in series with the emitter current and in intimate thermal contact with the emitter junction. A concomitant consequence of this analysis is that at a given voltage and power level (and consequently a given current), the voltage drop across the resistive layer of FIGURE 7 will be higher in the ratio 0.076/0.04 and the gain correspondingly lower.

For the case of $n_{\mu n}=0$, FIGURE 7 shows that the temperature rise when $V=0.04\ V_s$ must be restricted to below $t=0.16$ and thus requires that the maximum power be limited to the values below $$P_M=[P_s t \text{ or } P_s(e^t-1)]=[0.16\ P_s \text{ or } 0.174\ P_s] \quad (27)$$

depending on the heating law. If $P_M$ exceeds 0.2 $P_s$, the transistor with $n_{\mu n}=0$ will have a negative resistance, and a pair operating in parallel will become unstable so that current hogging occurs. For $n_{\mu n}=2.5$, however, the temperature limitation for V less than 0.076 $V_s$ arises not from negative resistance effects but instead from materials limitations which may result in melting of eutectics or solders, or other thermal damage.

Consequently, simultaneous operation with emitter-collector voltage V greater than 0.05 $V_s$ and power dissipation P greater than 0.16 $P_s$ is made possible by the addition of the emitter resistance with positive temperature coefficient in intimate thermal contact with the emitter junction. Since $V_s$ may be expressed in terms of $P_s$ and $R_s$ in keeping with Equations 16, 17 and 18, the improvement made possible by a positive temperature coefficient of resistance permits operation in the range $$V_M>0.05\ V_s=0.05\ P_s R_s/U_s$$
$$=0.5\ P_s R_s q/kT_s \quad (28)$$

$$P_M>P_s/6 \quad (29)$$

Figure 9:
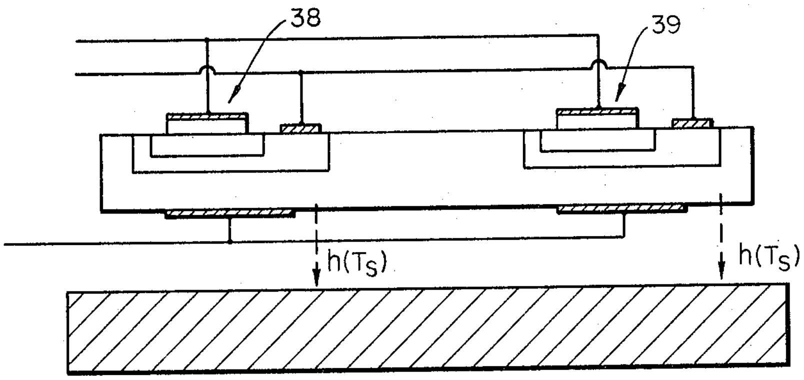
FIGURE 9 shows two transistors having a large mutual thermal conductance compared to the conductance to the heat sink.

In many cases, transistors may be mounted on a chassis giving high thermal conductance between the transistors compared to thermal conductance to the heat sink. For such a situation, the instability which leads to current hogging may be controlled by the mutual heat conductance between the transistors. For two transistors 38 and 39 in an arrangement as represented in FIGURE 9, an effective heat conductance may be defined as follows: Let the power dissipated in one transistor be increased by 1% and decreased by 1% in the other. Let the increase in temperature in one transistor be denoted by $T_{0.01}$. Then the effective heat conductance is defined as $$h'-0.01\ P/T_{0.01} \quad (30)$$

where P is power dissipated in the transistor. The ratio of this heat conductance to $P/(T-T_s)$ is called the mutual heat conductance factor. Since 1% distrubances, in general, result in linear disturbances in heat flow, the effective heat conductance can be used in analysis similar to that leading to Equations 4, 5 and 6. The stability condition is found to be $$a_0 P/T\ h'<1 \quad (31)$$

corresponding to a temperature rise above the heat sink given by $$P/h(T_s)<[h'/h(T_s)]\ T/a_0 \quad (32)$$

In this expression, the power 2P dissipated by the two transistors is taken to flow to the heat sink through a thermal conductance $2h(T_s)$.

For a silicon transistor, as discussed below Equation 11, $T/a_0 \cong 10°$ C. Thus, if the mutual heat conductance factor $h'/h(T_s)$ is much greater than unity, temperature rises of greater than 10° C. above the heat sink are possible.

The stability condition can also be written in the form $$P/h'<T/a_0 \quad (33)$$

which for silicon transistors requires that the temperature rise corresponding to the power dissipated in one transistor flowing through the mutual heat conductance should be less than $T/a_0$. By reducing $a_0$ to $a_{0r}$ through the presence of a resistive emitter layer, significantly greater values than $T/a_0$ can be obtained for $P/h'$.

For large groups of parallel transistors, a treatment like that for an extended transistor structure can be used.

Figure 10:
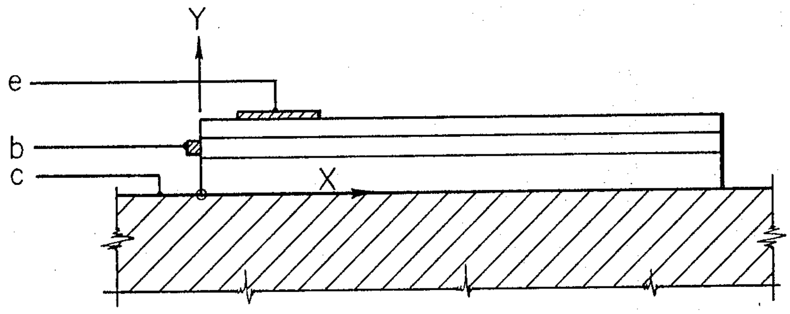
FIGURE 10 shows an external transistor structure used in calculating the mutual heat conductance factor.

For extended transistor structures, the actual disturbances involve an increase in temperature and current in one portion of the device and a decrease in other portions for a structure like that of FIGURE 10. Under these conditions, heat flow will occur between the hot portion and the cold portion. As a result of this, the effective heat conductance corresponding to a stability condition like Equation 3*b* is larger than the heat flow to the ambient or heat sink. As a result, Equation 3*b* should be modified:

$$a_0(d\ln T/d\ln H)$$
$$=(\text{mutual heat conductance factor}) \quad (34)$$

where the mutual heat conductance factor can be taken to be defined as follows: Consider the situation in which the electrical power over the entire device is increased by 1%. This will produce an increase in temperature that can be calculated by heat flow theory including rise of heat flow Equation 5 or 7. Now consider the internal instability mode of disturbance in which the thermal dissipation in one part of the device increases by 1% and the thermal dissipation in another portion of the device decreases by 1%. Under conditions in which the transistor is held at constant current, these increases will be such that the total current remains constant; and for the linear disturbance which occurs at the onset of the instability, the voltage will not change. Consequently, the total power remains constant, and part of the disturbance represents an additional inward flow of power and the other portion, an outward flow of power. To a rough approximation, the region of increasing power can be taken to be the area which contains approximately one-third of the total power and has the highest temperature rise, whereas the heat sink can be taken to be the region which has also approximately one-third of the total power and the lowest temperature rise. Now consider a disturbance of 1% increase in power in the hottest third and a decrease of 1% in the lowest third. This 1% change will produce a change in temperature which is smaller than would a uniform 1% change over the device as a whole. The ratio of these two changes is the mutual heat conductance factor which may be substantially greater than unity. For the particular geometry considered in FIGURE 10, the mutual heat conductance factor can be seen to be approximated by $$(\text{mutual heat conductance factor})$$
$$=(\pi Y/X)\coth(\pi Y/X) \quad (35)$$

where Y and X are the quantities defined in FIGURE 10.

Where the transistor has a high internal thermal conductance compared to its conductance at the heat sink, temperature rises much larger than the 10° discussed in connection with Equations 6 and 8 will be possible without internal instability occurring.

If the 1% power change, which is imagined to be externally applied, produces a temperature change $T_{0.01}$ in the hotter region, then this temperature change will produce a fractional increase in current, and hence of local power density of $a_0 T_{0.01}/T$ if the voltage remains constant. If this change is greater than 1%=0.01, instability will, in general, occur since a spontaneous fluctuation of current can then produce a temperature rise which, in turn, can produce an even greater increase in current with resultant build-up of the fluctuation. Since $a_0$/T is approximately $10^{-1}$/° C. for a silicon transistor, it is evident that $T_{0.01}$ must be less than 0.1° C. in order that $a_0 T_{0.01}/T$ be less than 0.01. This sets an approximate upper limit on temperature rises produced by the disturbance considered, and temperature rises as large as 0.15° C. cannot safely occur unless $a_0$ is reduced by adding the resistive emitter layer.

It is thus evident that the reduction of $a_0$ by a resistive emitter layer, especially one with a positive temperature coefficient of resistance, will permit corresponding increments in temperature rise for structures having large mutual conductance factors, as well as they will for individual transistors.

The considerations discussed in the preceding sections apply not only to transistors but also to other junction devices such as simple two-layer diodes, four layer diodes and controlled rectifiers, for example.

It should be noted that the increasing thermal resistance of silicon at higher temperatures has an adverse effect by increasing the ease of occurrence of negative resistances. If, on the other hand, most of the temperature drop occurs in metal having a substantially temperature independent thermal conductivity, then the curves of FIGURES 6, 7 and 8 are modified by increasing all the powers at a given temperature and hence the voltages at a given temperature and current. Since this increase is larger at higher temperature, the effect of conducting the heat chiefly through metal rather than silicon will be to impart an additional upward slope to the $y-x$ curves, especially where they have small negative slopes. Thus, maximizing metal conduction paths will improve the stabilization against thermal instabilities and will permit higher temperatures of operation. In addition, the greater thermal conductivity of metals can contribute directly to greater power handling capacity at a given temperature rise. Metal heat conduction applied directly to the emitter body will also increase power handling capacity.

In the case of a junction diode or power rectifier operating in the forward direction, the current depends upon voltage and temperature in much the same way as does the emitter current depend upon temperature and emitter base voltage. Consequently, the possibility of negative resistance due to thermistor action exists, and the phenomenon of current hogging can occur in much the same way.

For a power rectifier, it is important to keep the voltage drop across the device as small as possible. For this reason, voltage drops which would be quite acceptable in producing highly reliable stabilization in a power transistor might result in doubling the power dissipation in a rectifier. For these applications, it may, therefore, be desirable to use additional physical principles which, although they might be advantageous in power transistors, also might not actually be as necessary there.

Figure 11:
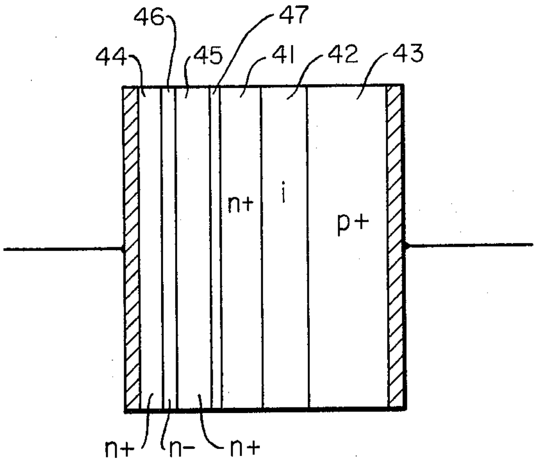
FIGURE 11 shows a rectifier incorporating the invention.

For a power rectifier, one of the important problems is that if current hogging occurs and a hot spot forms, the rectifier may be destroyed. As was discussed above, a distributed resistive emitter layer in a power transistor is extremely effective in reducing current hogging effects and can do so under circumstances in which there is a relatively small voltage drop across the resistive layer. In a power rectifier, this resistive layer should be in series with the rectifying junction. FIGURE 11 illustrates one way in which such a structure might be formed. The rectifying portion of the device is represented as an $n+-i-p+$ structure designated by numerals 41, 42 and 43, respectively. To the left of this device in the figure is a distributed resistance in the form of a resistive layer. This is represented as having two $n+$ contacting regions 44 and 45 containing between them an $n-$ layer 46. The distributed resistance and the rectifier portions are separated by a thin layer of metal 47 which is intended to prevent injection of holes from the rectifying region into the resistive layer region which might modulate the conductivity of this region in an undesirable way. Alternatively, the layer of metal might be replaced by a region of extremely short hole lifetime and very high donor doping so as to prevent the injection of holes into this region. Still another possibility is to make the $$(n+)-(n-)-(n+)$$

resistive layer region of a material of very much higher energy gap than the rectifying region, so that the hole density will be less in it as a result of the mass action law as previously described.

For the very thin high resistance layer of FIGURE 11, it is evident that a voltage drop of .1 volt may produce electric fields of many thousands of volts per centimeter. For example, if the $n-$ layer is one micron thick, a voltage of one volt will produce a field of $10^4$ volts per centimeter. For such high electric fields, there is an additional advantage that the mobility of the carriers in the layer may be reduced due to the so-called hot carrier effect. These effects have been discussed, for example, by E. J. Ryder, Phys. Rev. 90, 767 (1953), and W. Shockley, Bell Syst. Tech. J. 30, 990 (1951). Similar effects occur for other materials, and it is not necessary that the resistive layer be made of the same semiconductor material as the rectifying junction in FIGURE 11.

It is evident that the resistive layer will reduce the voltage of the rectifying region when the current density becomes high. If a current density increase of, for example, thirty-fold is necessary to produce damage in the semiconductor device, then it is evident that a voltage drop for normal current density of less than 10 millivolts will be sufficient to cause voltage drops of several tenths of a volt through the resistive layer before the damage point is reached. Such voltage drops will dominate the temperature rise and prevent the build-up of undesired current.

These considerations show that protection against local hot spots in power transistors can be accomplished by the addition of suitable resistive layers while increasing the power dissipation for normal operation by substantially less than 10%. In keeping with the considerations given above, it is evident that with the aid of a resistive emitter layer, a power rectifier can be made in which a 1% increase and decrease in the two most remote one-third regions of the power supply can produce temperature differences substantially greater than 0.1° C. without lateral instability developing.

Similar difficulties in respect to thermistor action and current hogging have been found in four-layer diodes. For these diodes, it is well known that the device may be destroyed by very high currents. These high currents produce points of local burnout. It is also known that the "holding voltage" of the diode decreases with increasing temperature, and also the voltage decreases at higher currents with increasing temperature.

It is evident that similar considerations will apply to a protective distributed resistive layer for such devices.

I claim:

1. In a semiconductor device including a semiconductor body having first and second regions of given and opposite respective conductivity types with a PN junction having a given area therebetween, said first region serving to inject carriers into said second region and having an exposed surface area disposed in juxtaposition with said given area, said device exhibiting a positive temperature coefficient of current flow such that an increase in the specific current flowing across a localized portion of said given area produces additional heating of said localized portion which results in an increase in said specific current, the improvement comprising:

distributed resistance means electrically connected to said surface area, said resistance means having a localized resistance in series with each of said localized portions such that the voltage developed across each of said localized resistances is dependent upon the specific current flowing across a corresponding one of said localized portions, distributed electrode means contiguous with said distributed resistance means, the value of said resistance means being sufficient to substantially reduce said positive temperature coefficient of current flow thereby to stabilize the current density across said given area.

2. The improvement according to claim 1, wherein each of said localized resistances is in intimate thermal and electrical contact with said exposed surface area.

3. The improvement according to claim 2, wherein at least one of said localized resistances has a positive temperature coefficient of resistance.

4. The improvement according to claim 2, wherein said resistance means comprises a conforming layer disposed on said exposed surface area and substantially coextensive with said given area.

5. The improvement according to claim 1, wherein the resistance of those of said localized resistances relatively proximate to the periphery of said exposed surface area is substantially greater than the resistance of those of said localized resistances relatively remote from said periphery.

6. The improvement according to claim 1, wherein the value of said resistance means is such that at the operating temperature of said device each of said developed voltages is substantially greater than the thermal voltage at said temperature across the corresponding one of said localized portions.

7. The improvement according to claim 6, wherein each of said developed voltages is not less than four times the corresponding thermal voltage.

8. The improvement according to claim 1, wherein said first region comprises a plurality of operating portions each contacted by a corresponding one of said localized resistances.

9. The improvement according to claim 8, wherein said second region comprises a plurality of operating parts each contiguous with a corresponding one of said operating portions and forming a corresponding one of said localized portions therewith.

10. The improvement according to claim 1, wherein said device is a transistor and said first and second regions are the emitter and base regions of said transistor respectively.

11. The improvement according to claim 1 wherein said distributed resistance means comprises a layer of semiconductive material.

12. The improvement according to claim 11, further comprising means for reducing injection of minority carriers into said layer of semiconductive material.

13. A semiconductor device as in claim 3, wherein said positive coefficient of resistance is greater than 1.0/*T* where T is the temperature of the distributed resistance means.

References Cited by the Examiner

UNITED STATES PATENTS

| | | | |
|---|---|---|---|
| 2,714,702 | 8/1955 | Shockley | 317—235 |
| 2,899,610 | 8/1959 | Van Amstel | 317—234 |
| 3,029,366 | 4/1962 | Lehovec | 317—235 |
| 3,040,197 | 6/1962 | Gudmundsen | 317—235 |
| 3,056,100 | 9/1962 | Warner | 317—234 |
| 3,067,485 | 12/1962 | Ciccolella et al. | 317—235 |
| 3,069,604 | 12/1962 | Ruehrwein | 317—234 |
| 3,145,447 | 8/1964 | Rummel | 317—234 |
| 3,159,780 | 12/1964 | Parks | 317—234 |
| 3,214,652 | 10/1965 | Knowles | 317—235 |

FOREIGN PATENTS

| | | |
|---|---|---|
| 1,213,905 | 11/1959 | France. |
| 810,452 | 3/1959 | Great Britain. |

OTHER REFERENCES

Epitaxially Diffused Transistor Fabrication, IBM Technical Disclosure Bulletin, by Ligten, vol. 4, No. 10, March 1962. (Pages 58 and 59 relied on.)

JOHN W. HUCKERT, *Primary Examiner.*

J. D. CRAIG, *Assistant Examiner.*

UNITED STATES PATENT OFFICE

CERTIFICATE OF CORRECTION

Patent No. 3,286,138 November 15, 1966

William Shockley

It is hereby certified that error appears in the above numbered patent requiring correction and that the said Letters Patent should read as corrected below.

In the heading to the printed specification, lines 4 and 5, for "assignor to Clevite Corporation, a corporation of Ohio" read -- assignor, by mesne assignments, to International Telephone and Telegraph Corporation, New York, N. Y., a corporation of Maryland --.

Signed and sealed this 12th day of September 1967.

(SEAL)
Attest:

ERNEST W. SWIDER
Attesting Officer

EDWARD J. BRENNER
Commissioner of Patents